United States Patent [19]
Morgan et al.

[11] Patent Number: 5,994,906
[45] Date of Patent: Nov. 30, 1999

[54] FLUID MEASUREMENT OF DIELECTRIC PROPERTY CHANGE IN HYDRAULIC FLUID

[75] Inventors: Dennis E. Morgan, San Diego; Eric J. Hangartner, Ramona; Jerry Collum, San Diego, all of Calif.

[73] Assignee: Caterpillar Inc., Peoria, Ill.

[21] Appl. No.: 08/799,280

[22] Filed: Feb. 13, 1997

Related U.S. Application Data

[60] Provisional application No. 60/034,824, Dec. 19, 1996.

[51] Int. Cl.$^6$ ................................................ G01R 27/26
[52] U.S. Cl. .......................... 324/633; 92/5 R; 91/189 R; 324/635
[58] Field of Search ............................ 91/189 R; 92/5 R; 324/635, 636, 633

[56] References Cited

U.S. PATENT DOCUMENTS

| | | |
|---|---|---|
| 4,737,705 | 4/1988 | Bitar et al. ................................ 324/58.5 |
| 5,150,060 | 9/1992 | Bitar ........................................ 324/635 |
| 5,182,979 | 2/1993 | Morgan ..................................... 92/5 R |
| 5,241,278 | 8/1993 | Bitar ........................................ 324/635 |
| 5,325,063 | 6/1994 | Morgan ..................................... 324/636 |
| 5,438,274 | 8/1995 | Bitar et al. ............................... 324/636 |
| 5,471,147 | 11/1995 | Allen et al. ............................... 324/635 |

*Primary Examiner*—Maura Regan
*Attorney, Agent, or Firm*—Al Riddles; Steven G. Kibby

[57] ABSTRACT

The identification of and compensation for changes in the dielectric properties of a hydraulic fluid in hydraulic apparatus is achieved by continuously sampling a hydraulic fluid in a resonant chamber with a central conductor that is both inductively and capacitively coupled to an oscillator. The output frequency changes of the oscillator is an indicator of changes of the dielectric properties of the hydraulic fluid and their magnitude. The invention is of particular value in hydraulic cylinder piston position determining systems.

11 Claims, 4 Drawing Sheets

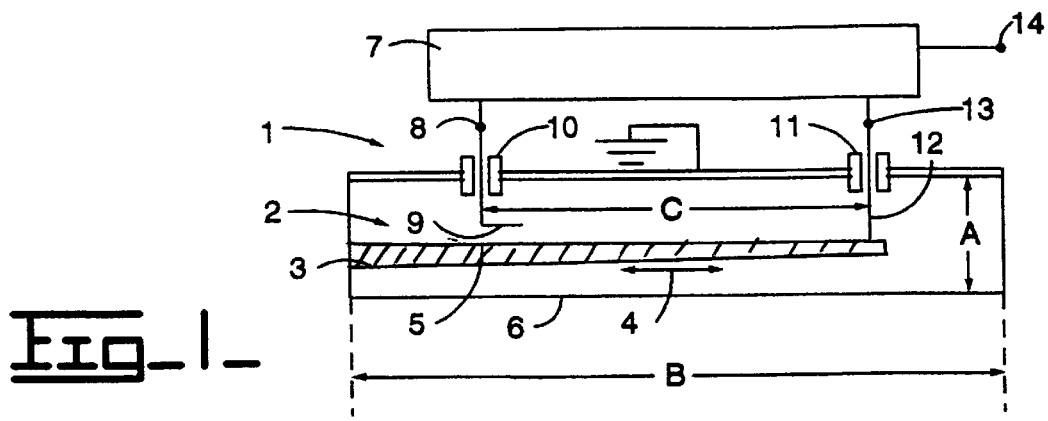
Fig_1_
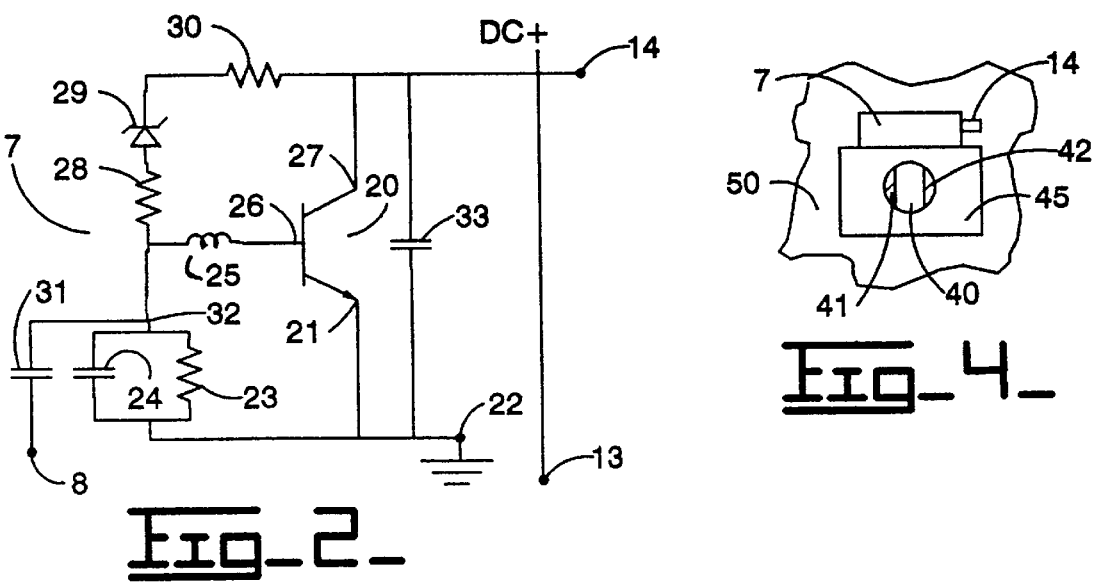
Fig_2_
Fig_4_
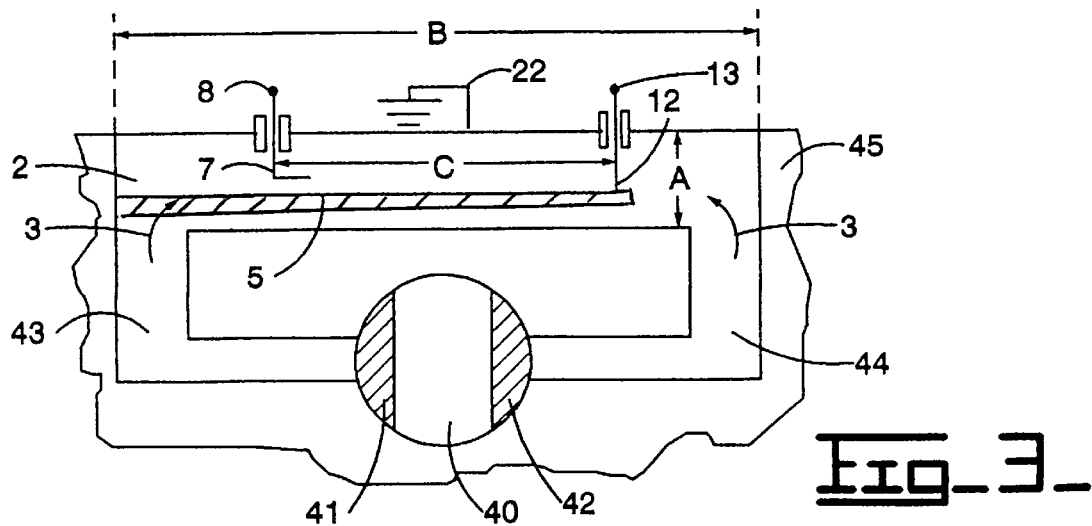
Fig_3_

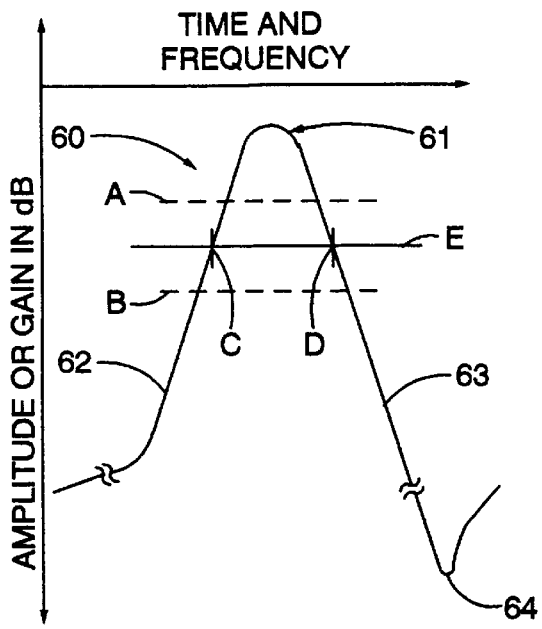
Fig_5_
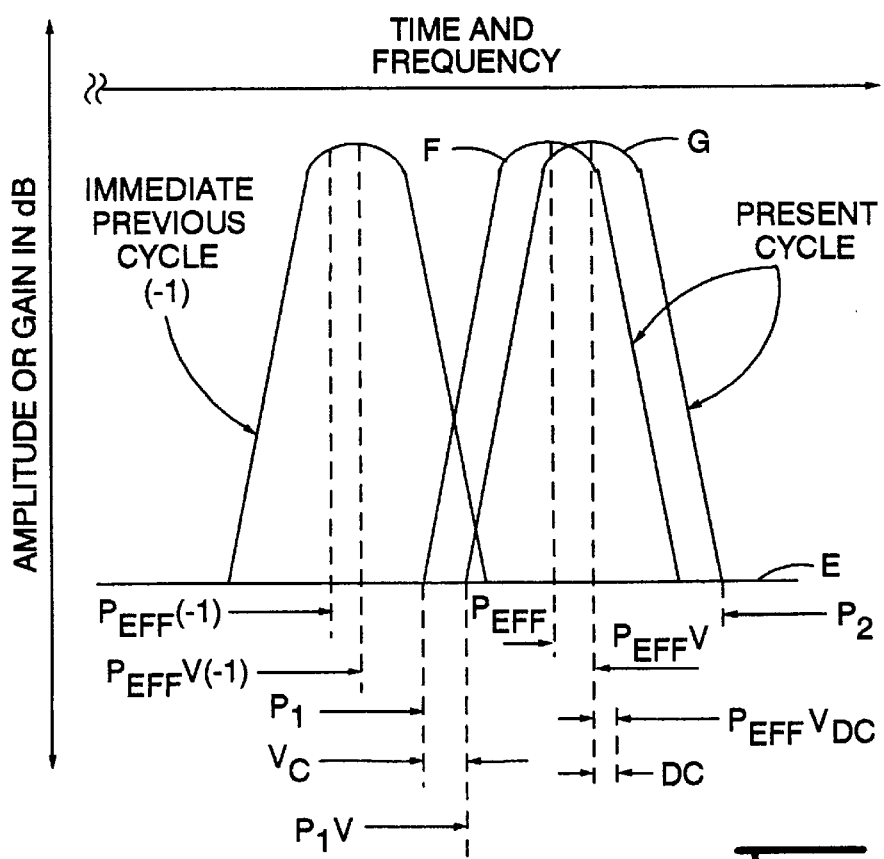
Fig_6_

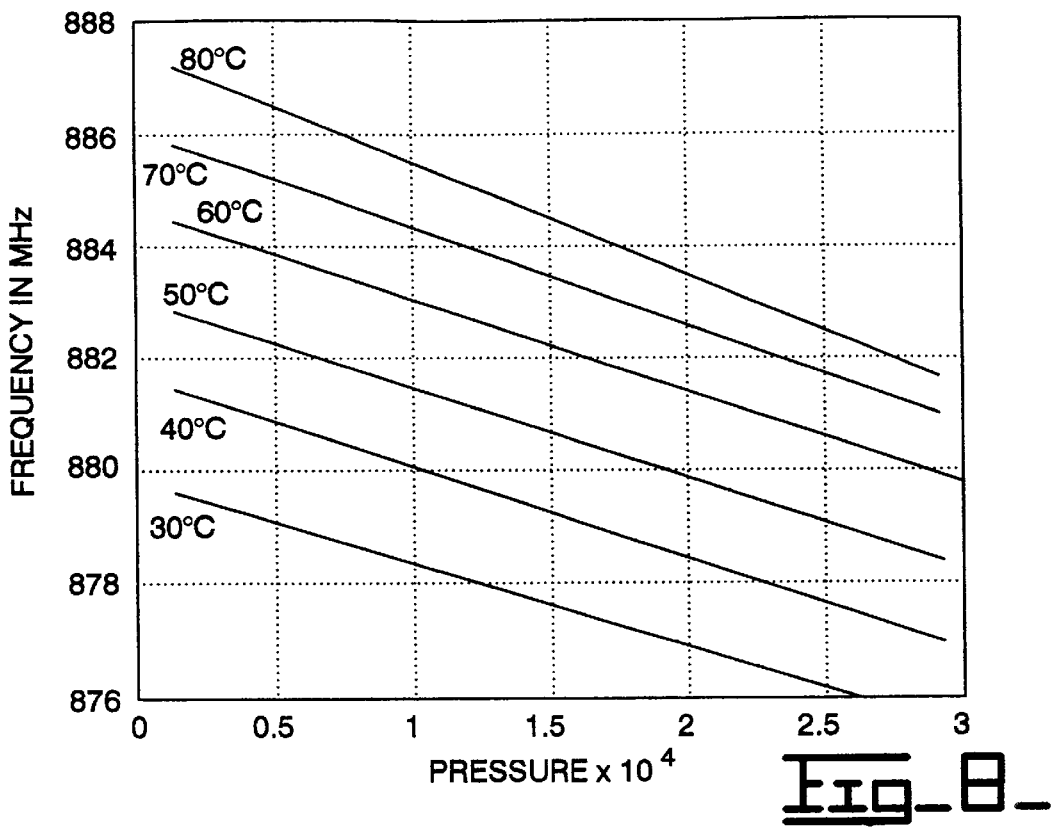
Fig_8_
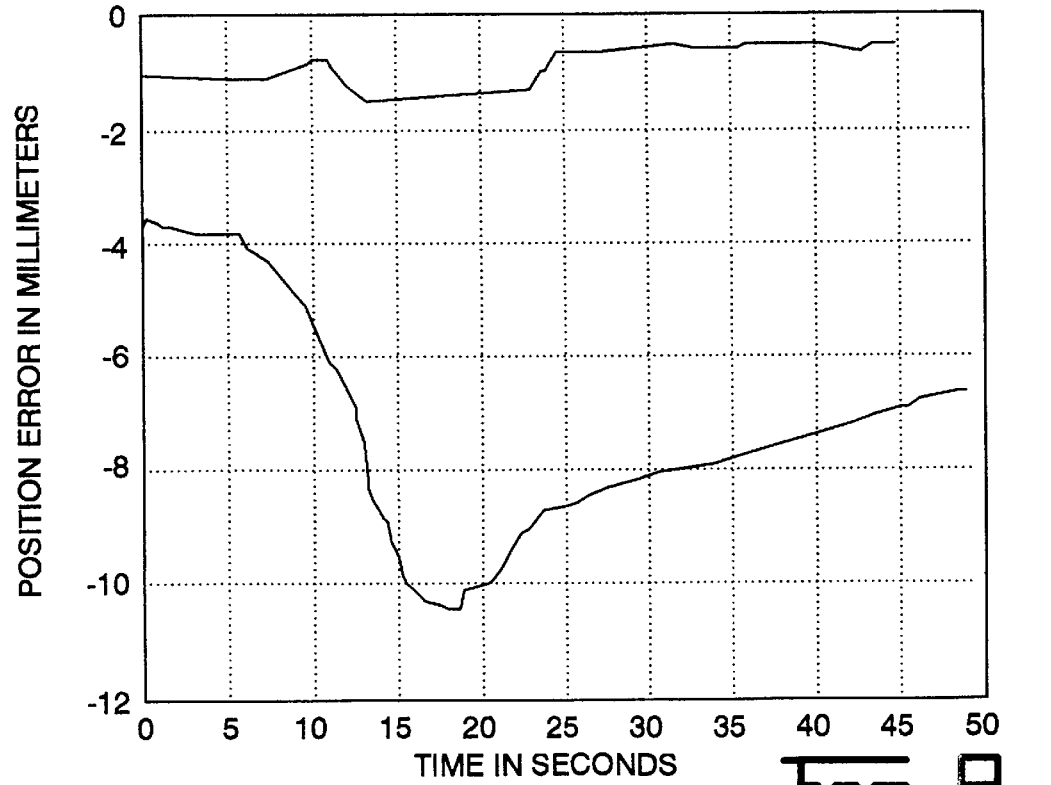
Fig_9_

FLUID MEASUREMENT OF DIELECTRIC PROPERTY CHANGE IN HYDRAULIC FLUID

This application is based on the material disclosed in U.S. provisional patent application Ser. No. 60/034,824 filed Dec. 19, 1996.

FIELD OF THE INVENTION

The invention relates to the indication and measurement of change in the dielectric properties of hydraulic fluid and in particular to a reference oscillator indicating and providing a basis for compensation for the effects of contamination in the sensing of the position of a piston in a hydraulic cylinder through the use of electromagnetic waves in the cylinder.

BACKGROUND AND RELATION TO THE PRIOR ART

In the use of apparatus employing a hydraulic fluid, the performance of the apparatus can be affected by a change in the dielectric properties of the hydraulic fluid. The change may be the result of lot to lot differences in the hydraulic fluid and it may result from air or other material being absorbed into the hydraulic fluid. Frequently control of dielectric property changes is made more difficult by the fact that there may be more than one parameter producing the change within a single range.

The problem is particularly acute in hydraulic cylinder piston position sensing systems that handle the increasingly stringent operational criteria encountered in precisely, reliably and continuously sensing the position of the piston and it's related displacement parameters, velocity and acceleration using an electromagnetic signal. A correlation is made of resonances of electromagnetic waves in the cavity that is made up of the cylinder and the piston, with the dimensions of the cavity, where the wave performance is similar to that of an electrical transmission line with shorted ends, in that the resonance frequency of the electromagnetic standing wave correlates inversely with the cavity length.

In U.S. Pat. No. 4,737,705, a coaxial resonant cavity with a central core is employed within which the electromagnetic waves are launched and propagated in the mode referred to as the transverse electromagnetic wave (TEM) mode. The cylinder on the rod side of the piston is one type of coaxial cavity.

In U.S. Pat. No. 5,182,979, compensation, through equalization, is provided for differences in insertion losses as the linear extension of the piston and rod in the cylinder takes place.

In U.S. Pat. No. 5,325,063 identification of a fundamental resonance frequency is enhanced by the use of positive and negative slope intercepts of a resonance signal with respect to a reference level, where the positive slope is at the lower frequency and the negative slope is at the higher frequency.

As progress in the art of electromagnetic wave piston position sensing in hydraulic cylinders continues, the effects of the condition of the hydraulic fluid resulting from wide pressure and temperature range operation and contamination such as that existing in lot to lot oil supplies and from air and other contaminant entrainment through leaking seals, may introduce error and interfere with achieving desired precision.

SUMMARY OF THE INVENTION

Variations in the dielectric properties of a hydraulic fluid are compensated by providing a combined oscillator and resonant cavity element wherein a resonance is produced in a sample of the hydraulic fluid, the variations in the frequency of which correlate with changes in the dielectric properties of the hydraulic fluid.

The principle of the invention involves a reference oscillator the frequency of which is correlated with the dielectric properties of the hydraulic fluid. A standing wave is generated in a resonant cavity having a fixed dimension, so that any changes in the resonant frequency from a calibration reference frequency can be assumed to result from changes in the dielectric properties of the fluid.

There is a central conductor in the resonant cavity with inductive coupling into the resonance at one point along the resonant cavity and at a separated point along the resonant cavity there is capacitive coupling into the resonance. The changes in output frequency of the oscillator produce a measurement indicative of dielectric changes in the hydraulic fluid. Where the apparatus is a piston position sensor the correction factor is applied to the piston position location determined by the sensor to increase accuracy of the location.

BRIEF DESCRIPTION OF THE DRAWINGS

FIG. 1 is a schematic illustration of the oscillator-resonant cavity unit of the invention.

FIG. 2 is a circuit diagram of one embodiment of the oscillator portion in the oscillator-resonant cavity unit of the invention.

FIG. 3 is a schematic diagram of the fluid flow paths of the resonant cavity portion of the oscillator-resonant cavity unit as employed in a hydraulic cylinder piston position sensor embodiment of the invention.

FIG. 4 is a schematic view showing an outline of the oscillator-resonant cavity unit of the invention positioned around the inlet-outlet port of a hydraulic apparatus.

FIG. 5 is a depiction in the form of a graphical illustration of Amplitude or Gain vs Time and Frequency of the portion near the peak region, of the shape of a typical resonance signal in a hydraulic piston position sensor from which portion information for piston position determination is to be based.

FIG. 6 is a graphical representation of gain vs time and frequency at the reference level E of FIG. 5, depicting the time and frequency relationship of the resonance signal at both the immediate previous processing cycle and the present processing cycle, illustrating the factors involved in determining piston position including the dielectric property change in the hydraulic fluid compensation correction.

FIG. 8 is a graph showing reference oscillator change in frequency versus pressure at various temperatures.

FIG. 9 is a graphical illustration of piston position error versus time showing performance both with and without the dielectric constant variation correction.

DESCRIPTION OF THE INVENTION

Figure 7:
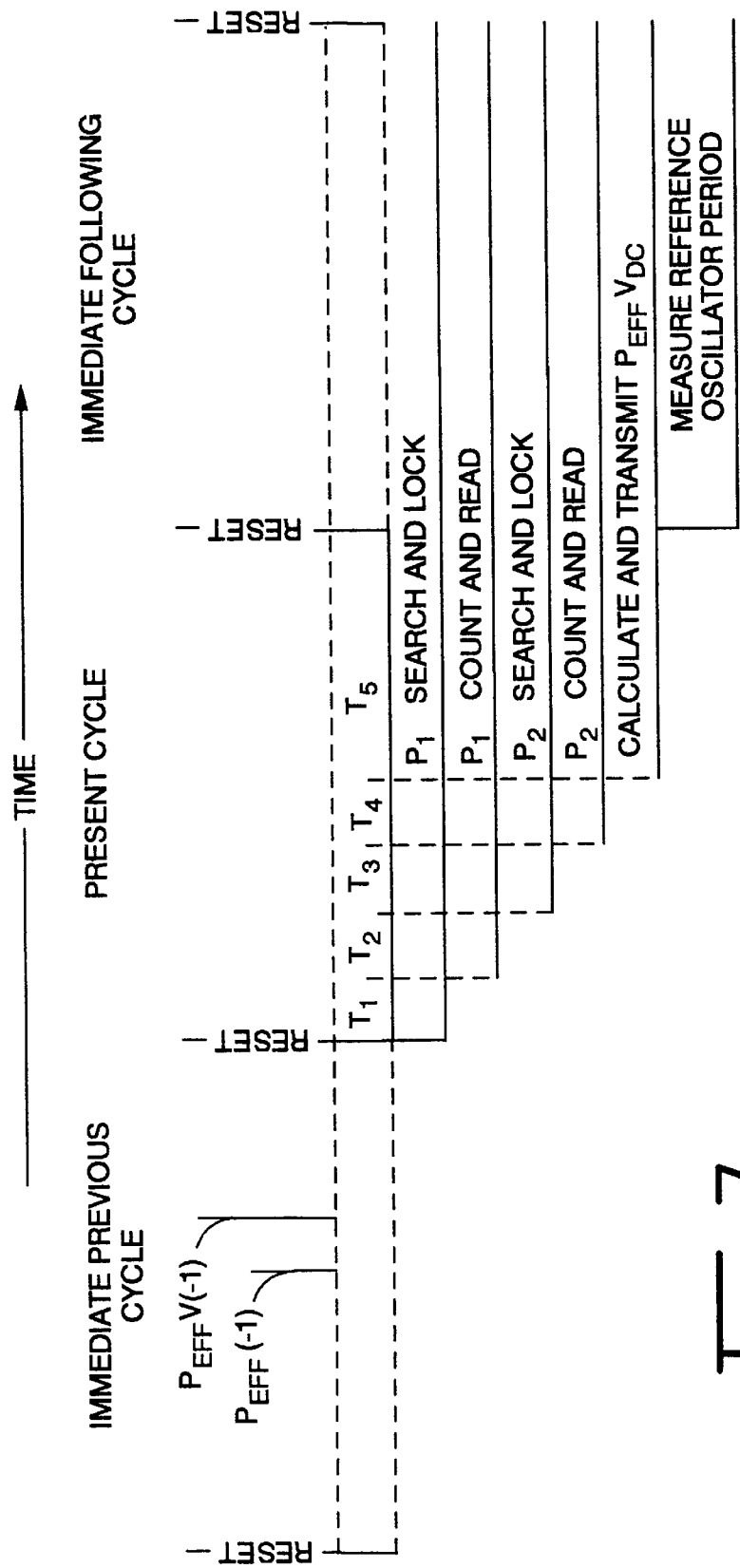
FIG. 7 is a timing chart illustrating a correlation in the timing cycle timeframe of the piston velocity compensation and the dielectric change compensation in piston position determination.

In apparatus that uses a hydraulic fluid, changes in the dielectric properties of the hydraulic fluid may affect the performance of the apparatus. In accordance with the invention, changes in the dielectric properties of a hydraulic fluid are manifested by changes in frequency of an oscillator that has a central conductor in a resonant cavity that is filled with the hydraulic fluid and wherein the oscillator transmits energy into the resonant cavity inductively at one location along the length of the resonant cavity and is capacitively coupled into the resonant cavity at a separated location along the length of the resonant cavity. The dimensions of the resonant cavity and the frequency of the oscillator are interrelated as a unit in that the oscillator sets up a resonance in the resonance cavity in a range of output frequency and changes in dielectric properties of the hydraulic fluid in the resonance cavity produce changes in the oscillator output frequency within that range. In instances where dielectric changes involve multiple parameters the effect of an individual linearly varying parameter can be separated by a characterization operation.

Referring to FIG. 1, there is shown a schematic diagram of an oscillator-resonant cavity unit of the invention for use in identifying changes in dielectric properties of a hydraulic fluid. The unit 1 is made up of a resonant cavity 2 with a diameter or width dimension "A" and a length dimension "B" which is filled with a hydraulic fluid 3 and which, in this embodiment may flow in both directions as depicted by the double headed arrow 4, as the apparatus with which the unit 1 is associated, is actuated. A conductor 5 is positioned coaxially in the resonant cavity 2 (equidistant from the circumferential surface 6), and is connected to electrical ground. An oscillator 7 transmits a high frequency signal through a terminal 8 and an inductive coupler 9 into the fluid 3 at a first location 10 along the central conductor 5. At a second location 11 along the central conductor 5 separated by a dimension "C" from the first location an inductive coupler 12 including the central conductor 5 is connected through a terminal 13 to the oscillator 7. The output of the oscillator 7 is available at terminal 14. In operation the oscillator 7 sets up a resonance which may be described as a frequency at which energy is transferred to another mode in the fluid 3 in the resonant cavity. Any change in the dielectric properties of fluid 3 alter the frequency of the oscillator 7. The frequency range of the oscillator and the dimensions in the resonant cavity are interrelated.

Referring to FIG. 2, an embodiment of an oscillator circuit is shown that will perform the functions of the oscillator element 7 of the oscillator-resonant cavity unit 1 of FIG. 1. In FIG. 2 the circuit includes a bipolar transistor 20, having the emitter contact 21 thereof connected to the ground at terminal 22 and having a first resistor 23 and first capacitor 24 connected in parallel with each other and the combination in series with an inductance 25, connected as a circuit branch between the emitter contact 21 and the base contact 26 of the transistor 20. In the circuit branch between the base contact 26 and the collector contact 27 of the transistor 20 there is a second resistance 28, a Zener diode 29 and a third resistance 30 connected in series with inductor 25. There is a second capacitor 31 connected between a node 32 and a terminal 8. There is a third capacitor 33 connected between the emitter contact 21 and the collector contact 27 of the transistor 20. The terminal 13 is connected to the collector contact 27 of the transistor 20. The input of D.C. power and the output of the oscillator 7 is available at terminal 14.

In operation the transistor 20 with the associated circuitry oscillates in a limited frequency range which changes with changes in the dielectric properties of the fluid in the resonant cavity. The oscillator-resonant cavity unit 1 of the invention in practice is tailored to provide the information desired about the fluid 3 in the resonant cavity 2. The oscillator 7 is designed in compatibility with the dimensions of the resonant cavity 2 to support a resonance in the fluid 3 with provision for fluid sampling to accommodate the requirements of the particular application to which it is to be applied. The unit 1 of the invention is particularly valuable in an embodiment where the position of a piston in a hydraulic cylinder is sensed using electromagnetic waves in the hydraulic fluid in the cylinder. In such an application, contamination, such as lot to lot differences in hydraulic fluid, and air or other material entrained in the hydraulic fluid, can limit the precision of determining the position of the piston.

In FIGS. 3 and 4, schematic illustrations are provided of an embodiment of a continuous fluid sampling resonant cavity that together with the principles set forth in connection with FIGS. 1 and 2 will constantly monitor and compensate for changes in the dielectric properties in the hydraulic fluid.

Referring first to FIG. 3, there is shown a schematic diagram of the fluid flow paths of the resonant cavity element 2 of the oscillator-resonant cavity unit 1 as employed in a hydraulic cylinder piston position sensor application of the invention. In FIG. 3 wherein like reference numerals for elements of previous figures are used where appropriate, the hydraulic fluid 3 passes into and out of the hydraulic apparatus such as a cylinder, not shown, through a main inlet-outlet port 40, being deflected by venturi baffles 41 for fluid flow in one direction and 42 for fluid flow in the other direction. The baffles 41 and 42 direct the fluid into ports 43 and 44 respectively providing continuous sampling of the hydraulic fluid as the apparatus operates. The sampled hydraulic fluid is transported into the dimension "A" diameter, dimension "B" length, resonant cavity 2 as the apparatus is actuated. The assembly is built into a housing 45 for positioning in the inlet-outlet fluid path of the apparatus. The capacitive coupler 9 and the inductive coupler 12 are positioned in contact with the fluid 3 of the resonant cavity 2 with a separation of dimension C along the central conductor 5. A resonance in the fluid 3 is supported at a frequency range with frequency changes within the range being affected solely by changes in dielectric properties of the fluid 3.

Referring to FIG. 4 a schematic view is shown of an outline of the housing 45 of the oscillator-resonant cavity unit 1 of the invention positioned around the inlet-outlet port 40 of a hydraulic apparatus 50. A coaxial cable, not shown, carries in D.C. power for the circuit of FIG. 2, which in turn superimposes a high frequency voltage on the D.C. signal indicative of dielectric property change produced frequency information read by a controller, not shown, from terminal 14.

The present invention relies on the discovery that changes in the reference oscillator frequency due to temperature, pressure, and fluid contamination variations in the sampled fluid are directly proportional to changes in the resonance frequency in the hydraulic cylinder. In the description which follows, the term "period" is substituted for frequency, but the latter can readily be derived simply by taking the inverse of any value referenced.

In order to calibrate the controller, the piston is moved to a known position and brought to an intermediate operating temperature. A reference oscillator calibration period $P_{RO-CAL}$ is determined by multiplying the measured reference oscillator period by the ratio between "known" and measured hydraulic cylinder resonance periods at the known position according to:

$$P_{RO-CAL} = P_{RO-MEASURED} \cdot P_{CYL-KNOWN} / P_{CYL-MEASURED}$$

where the known cylinder period is derived using the look up table in reverse to determine resonance periods from piston positions.

Once the reference calibration period is known, the same equation can be solved for $P_{CYL-KNOWN}$. Thereafter, corrected hydraulic cylinder resonance periods can be determined as a function of the calculated reference oscillator calibration period and measured reference oscillator and cylinder resonance periods. According to a present preferred embodiment, measured cylinder resonance periods are first corrected for piston velocity, then for changes in the dielectric properties of the fluid.

TECHNICAL APPLICATION

The unit 1 of the invention is particularly useful in a piston position sensing system which employs electromagnetic waves in the fluid of the hydraulic cylinder in the form of a varying frequency signal that is transmitted into the hydraulic fluid in the cylinder. The varying signal covers the range of frequencies at which resonance of the cavity that is made up of the cylinder, the piston and the cylinder end, will take place over the range of piston travel. A resonance frequency signal is sensed in the hydraulic fluid and is delivered to a signal receiver where information is extracted from the sensed frequency signal that permits identification of the position and motion parameters of the piston. In accordance with the invention compensation is provided for any dielectric property changes in the hydraulic fluid.

In this piston position determination system, positions and computations are based on the "period", which is the reciprocal of frequency, and which is linear with respect to piston travel and thereby permits tabulation of position, correction factors and clock counts.

An accurate effective value for the center period of a detected resonance signal, labeled $P_{eff}$ in the following discussion, of a resonance signal between the intercepts labeled $P_1$ and $P_2$ in the following discussion, would be a function of $P_1$ and $P_2$, the simplest example of which would be $P_2/P_1$ as expressed in Equation 1 in the following discussion. Any other equivalent expression of a resonance width parameter such as loaded "Q" could also be used.

In detecting the resonance width parameter the extremes are sensed with respect to a reference level. The intersection of each extreme with respect to a reference level is an event that occurs serially in time with respect to the other, and both cannot be detected simultaneously. Further in accordance with the invention, the dielectric properties of the hydraulic fluid may undergo some change.

The velocity of the piston has the effect of changing the separation between the $P_1$ and $P_2$ extremes of the resonance width parameter during the interval between the detection of the first and the detection of the second, and that in turn may affect the ability to lock onto the second slope of the resonance signal. Also, any change in the dielectric properties of the hydraulic fluid may affect the calculated position of $P_{eff}$. Increased accuracy and reliability is achieved where the reference level is selected in a specific operating region of the resonance signal shape away from a region that affects accuracy and a compensating factor is introduced for the velocity of the piston in the resonance width parameter.

Referring to FIG. 5, a depiction in the form of a graphical illustration of Amplitude or Gain vs Time and Frequency is provided of the portion near the peak region, of the shape of a typical resonance signal from which information on the resonance signal is to be extracted. The signal 60 has a peak region 61 above a positive slope 62 after which in time there is followed a negative slope 63 which often proceeds to an anti-resonance 64. The peak region 61 is noisy and the slope is so gradual that determining a definite resonance width parameter in this region would not be reliable. The positive and negative slopes respectively over the entire slope are highly non-linear. Such conditions would produce problems in mathematical corrections and false locking onto harmonics (cylinder resonance or source) other than the desired one. The best results are achieved in an operating region between limits A and B at a reference level about 5 dB below the peak region 61. In this operating region, definite and reliable, positive C and negative D slope intercepts of the reference level E with the slopes of the resonance signal can be detected. The frequency separation between the intercepts provide a unique piston position indication. The intercepts C and D occur serially on the time scale and cannot be detected simultaneously. The velocity of the piston in the interval between C and D operates to cause an apparent change in the separation or frequency difference between the positive and negative intercepts C and D which affects $P_{eff}$ and any change in dielectric properties of the hydraulic fluid also affects $P_{eff}$. Compensation for the movement of the piston during the interval between detection of the intercepts C and D by calculating a velocity based correction using information from a previous processing cycle and then using that calculated velocity based correction to define a new position for the positive intercept C. In accordance with this invention a reference oscillator compensation factor developed through the detection of any changes in dielectric properties of the hydraulic fluid as described in connection with FIGS. 1–4 above is applied to define a further revised position for $P_{eff}$.

The compensation factors are developed as depicted in FIG. 6. As specified in equations 1–4, to be described in the following, involving, for velocity compensation, calculating a value for velocity and then using the value in adjusting the position of the initial, which in the example where the piston is moving from an extended toward a collapsed cavity, is the positive intercept C of FIG. 5.

In the coming discussion, the following terminology is developed in connection with FIG. 6 and equations 1–4. The center period of a resonance is labeled $P_{eff}$. Where a velocity compensation value is applied the designation is $P_{eff}V$ or equivalent expression, and, where a dielectric property change compensation value is applied, the designation is $P_{eff}V_{DC}$. The measured signal identification data is $P_1$ and $P_2$ or equivalent. The resonance width parameter is the ratio $P_2/P_1$ or an equivalent expression that is an indication of the separation between the $P_1$ an $P_2$ intercepts.

The diagram of FIG. 6, which is a graphical representation of gain vs. time and frequency at the reference level E of FIG. 5, depicts the time and frequency relationship of the resonance signal at both the immediate previous processing cycle indicated as (−1) in the figure and equations), and the present processing cycle in terms of the "period" of the frequency values using the example where the piston is moving from an extended toward a collapsed cavity. In the FIG. 6 diagram, the positive intercept C of FIG. 5 is labeled $P_1$, and the negative intercept D of FIG. 5 is labeled $P_2$, curve F is the position of the resonance signal at $P_1$ and G is the position of the resonance signal at $P_2$.

Referring to FIG. 6, an accurate effective value ($P_{eff}$)for the center "period" of the resonance is a function of $P_1$ and $P_2$ that can be specified as $F(P_1, P_2)$, the simplest example of which would be expressed as in Equation 1.

$$P_{eff} = F(P_1, P_2) = (P_1 + P_2)/2 \qquad 1$$

The velocity correction Vc would be determined as in equation 2.

$$V_c = (P_{eff} - P_{eff}(-1))/T_c \qquad 2$$

Where $T_c$ is the elapsed time of the processing cycle. The velocity compensated value $P_1V$ for $P_1$ would be determined as in equation 3.

$$P_1V = P_1 + V_c T_e \qquad 3$$

Where $T_e$ is the time elapsed between $P_2$ and $P_1$. The velocity compensated effective value $P_{eff}V$ for the center "period" of the resonance, is a function of $P_1V$ and $P_2$ that can be specified as $F(P_1V, P_2)$, the simplest example of which is as expressed in Equation 4.

$$P_{eff}V = F(P_1V, P_2) = (P_1V + P_2)/2 \qquad 4$$

The "period" correction from the change in frequency of the oscillator 7 indicating a change in dielectric properties of the sample of hydraulic fluid 3 in the resonant cavity 2 is labeled $P_{eff}V_{DC}$ and is applied to the $P_{eff}V$ value. In this illustration it is shown as an added value.

Referring to FIG. 7 a timing chart is provided illustrating a correlation in the timing cycle timeframe of the piston velocity compensation and the dielectric change compensation on piston position determination. In the chart there are five time segments T1 to T5 in a cycle between reset signals. The cycle period includes "search" and "lock" periods for each of the positive and negative "lock on" points, and a calculation and transmission period in which the $P_{eff}$, $V_c$, $P_1V$, $P_1V$ and $P_{eff}V$ values are established, following the establishment of the $P_{eff}V$ value, after reset, the reference oscillator period is measured and the $P_{eff}V_{DC}$ is calculated and established.

In FIG. 7, at T1 the search and lock for the positive slope intercept $P_1$ of FIG. 6 takes place followed by a count and read period labeled T2. At T3 the search and lock for the negative slope intercept $P_2$ of FIG. 6 takes place followed by a count and read period labeled T4. In the T5 period the $P_{eff}$, $V_c$, $P_1V$, $P_1V$ and $P_{eff}V$ values are calculated. In the timing chart of FIG. 7 the addition of $V_c$ to the $P_{eff}$ value moves the $P_{eff}$ position to a position closer to $P_2$. Following Reset, in the immediately following cycle the reference oscillator period is measured and the dielectric property change compensation value is calculated and is then applied to $P_{eff}V$ as shown in FIG. 6, with the result labeled $P_{eff}V_{DC}$.

The dielectric property change in the hydraulic fluid indicated by a change in frequency at the output of the oscillator-resonant cavity unit 1 is produced by variations in temperature and pressure and by the effects of contamination of the hydraulic fluid. In FIG. 8 there is shown a graph of frequency range of about 875 to 888 MHz output frequency at terminal 14 in FIG. 1 vs hydraulic fluid pressure at temperatures at 10 degree increments from 30 to 80 degrees C. FIG. 8 demonstrates that effects from temperature, pressure and contamination are linear and can therefore be compensated for in the hydraulic cylinder by a proportional correction as described above.

In order to provide a starting place for one skilled in the art in practicing the invention the following example specifications of an oscillator 7 and resonant cavity 2 of an approximately 888 MHz oscillator-resonant cavity unit 1 as depicted in FIGS. 1–4, is provided.

| In the oscillator element 7. | | |
| --- | --- | --- |
| Voltage at terminal | 22 | +8 to +32 volts. |
| NPN Transistor | 20 | Hewlett Packard - AT-41411-BLK |
| Zener Diode | 29 | Motorola - MMBZ5237 B - 8.2 V |
| Inductor | 25 | 1.98 NanoHenry |
| Resistor | 23,28,30 | 3.01K Ohms |
| Capacitor | 24,31,32 | 0.33 Microfarad-Panasonic PCE 1008 |
| In the resonator element 2. | | |
| Coupler | 9 | Insulator plug |
| Coupler | 12 | Insulator plug - coupler oscillator |
| Dimension | "A" | 7 millimeters |
| Dimension | "B" | 57 millimeters |
| Dimension | "C" | 16 millimeters Referring to |

FIG. 9 a graphical illustration is provided of piston position error vs time showing a substantially reduced piston position error when there is compensation for dielectric property variation in the hydraulic fluid. In connection with FIG. 10 there is illustrated the circuitry involved in an electromagnetic wave piston position sensor with hydraulic fluid dielectric property change compensation. While there are a number of ways in the art of detecting a fundamental resonance frequency used as a piston position indicator in a piston position sensing system, the use of "frequency lock loop" circuitry to detect and track "lock on" points on the positive and negative slopes of the resonance signal, together with selection of the location level of those "lock on" points with reference to the maximum amplitude dB and width of the resonance signal at that location level, permits calculations that yield highly accurate resonance frequency values with accommodation for device and service performance differences in the sensing system. The criteria involved in the selection of the "lock on" level and measurement parameters are illustrated in connection with FIG. 5 wherein, the reference line E is the fixed threshold selected level at 5 dB below the resonance peak. $P_{eff}V$ would be the piston velocity compensated center period, divided by the band width at the intercepts C and D of the particular curve 60 with reference level E. In the selection of the gain level E the value of $P_2/P_1V$ is a resonance width parameter. There are other equivalent width parameters such as loaded "Q". The gain level for the reference level E is selected to be below the noisy peak region 61 and is typically 5 dB below that peak region 61.

The values of $P2/P_1V$ correlated with piston position are tabulated through a characterization operation and stored in a table indexed through $P_{eff}V$ or any other parameter correlated with piston position. A value of $P2/P_1V$ for the bandwidth between the intercepts equal to the value of $P_2/P_1V$ for the 5 dB below peak level and would be selected. The positive intercept C of FIG. 5 is labeled $P_1$ in FIG. 6 and the negative intercept D of FIG. 5 is labeled $P_2$ in FIG. 6.

As the frequency of the inserted signal into the cylinder increases and a "lock on" of a particular resonance occurs at $P_1$ a temporary frequency increment is added that moves the inserted frequency to the vicinity of and slightly beyond $P_2$ so that the frequency lock circuitry can search and lock onto the declining intercept at $P_2$. The velocity compensation of the invention operates to assure that the search for frequency lock on the negative slope will be at the changed location produced by the velocity, which is curve G in FIG. 6.

Each hydraulic cylinder is individually characterized so that a resonance width parameter that occurs at each piston position is available for comparison with any measured resonance width parameter taken at a piston position in operation. In this embodiment, each cylinder piston position sensing system is statically individually characterized by incrementally moving the piston throughout the cavity or stroke length in increments as small as the resolution of the sensing system will permit while the "period" values at $P_1$ and $P_2$ respectively are measured, $V_c$, $P_{eff}V$ and $P_1V$ are calculated and the correction DC is made to $P_{eff}V$; all are stored for each position. In addition the number of "counts" in each resonance at 16 MHz and, the "period" of each 16 MHz count, the transmitted frequency and the period of the transmitted frequency all correlated with piston travel distance are also tabulated. The stored information provides static measured information of the resonance frequency at each piston position throughout the stroke length. A look up table, with an appropriate index such as $P_{eff}V$ is assembled using the characterization information, and is employed in calculating a dynamic gain adjustment and in correlating counts in counters with piston travel. The stored information values that are placed in the look up table may be in the form for use, or calculations may be performed on the measured values, as each is used.

The events of the chart of FIG. 7 are executed each cycle. An actual adjustment change only occurs when needed.

What has been described is the identification of and compensation for changes in the dielectric properties of a hydraulic fluid in hydraulic apparatus in which continuously sampled hydraulic fluid is caused to exhibit a resonance in a resonant chamber, a central conductor of which is both inductively and capacitively coupled in an oscillator. The output frequency changes of the oscillator is an indicator of changes and their magnitude of the dielectric properties of the hydraulic fluid. The invention is of particular value in hydraulic cylinder piston position determining systems.

Other aspects, objects, and advantages of this invention can be obtained from a study of the drawings, the disclosure, and the appended claims.

What is claimed is:

1. In hydraulic piston position sensing apparatus of the type wherein changes in a resonant frequency within a hydraulic cylinder are representative of piston position, the improvement comprising:

a resonant frequency oscillator, and a fluid sample containing resonant cavity in fluid communication with the hydraulic cylinder and having a central conductor in said cavity coupled into said oscillator, whereby a change in a resonance in said cavity provides a change in output frequency of said oscillator indicative of changes in the dielectric properties of the fluid.

2. The improvement of claim 1, wherein said oscillator is inductively coupled into said central conductor at one location and is capacitively coupled into said central conductor at a separated location.

3. The improvement of claim 1 wherein said resonant cavity includes provision for fluid sample changing at each actuation of said apparatus.

4. The improvement of claim 1 wherein said oscillator includes at least one active amplifier element having at least a control electrode with a reactive circuit branch connected between said control electrode and another electrode of said active amplifier element and wherein there is inductive coupling between said central conductor and said reactive circuit branch.

5. In a hydraulic cylinder piston position sensing system of the type wherein electromagnetic wave resonance signals are correlated with the position of the piston, the improvement comprising:

measurement of a reference oscillator-resonant cavity output frequency as an indicator of dielectric property changes in the hydraulic fluid in said cylinder.

6. The improvement of claim 5 where said changes in output frequency are measured in terms of the period of said oscillator.

7. The improvement of claim 6 wherein said changes in output frequency is identification data used to calculate a resonance width parameter correction.

8. The improvement of claim 7 wherein said identification data is taken in a characterization operation at travel increments in actuation of the apparatus.

9. Apparatus for sensing the position of a piston in a hydraulic cylinder comprising in combination:

transmitting means adapted for introducing electromagnetic wave energy into the hydraulic fluid in said cylinder between said piston and the end of said cylinder, receiving means adapted for sensing resonance signals produced in said in said hydraulic fluid in said cylinder from said transmitted wave energy during travel of said piston, a resonant frequency oscillator, a fluid sample containing resonant cavity unit in fluid communication with the hydraulic cylinder and having a central conductor in said cavity coupled into said oscillator, whereby a change in a resonance in said cavity provides a change in output frequency of said oscillator, and processing means for determining a position of the piston based upon said sensed resonance signals, wherein said position includes a dielectric property change correction based upon said oscillator output frequency.

10. The apparatus of claim 9, wherein said sample cavity defines a constant fluid volume.

11. The process of establishing the piston position in a hydraulic cylinder piston position sensing system of the type wherein electromagnetic wave resonance signals are correlated with the piston position comprising the steps of:

characterizing each cylinder by storing information in tabulated form correlated with piston travel, on at least one resonance width parameter value, and on hydraulic fluid dielectric property change, for each piston position, introducing electromagnetic wave energy into the hydraulic fluid in said cylinder, sensing resonance signals in said hydraulic fluid during travel of said piston, detecting the presence of at least one width parameter of at least one said resonance signal during travel of said piston, measuring at least said at least one width parameter of at least one resonance during said piston travel, comparing at least one measured resonance width parameter as the piston travels with at least one stored resonance width parameter, and based on said comparison providing a piston position signal, measuring a reference oscillator-resonant cavity output frequency as an indicator of dielectric property changes in the hydraulic fluid in said cylinder, and correcting said piston position signal for any change in dielectric properties of said fluid.

* * * * *

UNITED STATES PATENT AND TRADEMARK OFFICE
CERTIFICATE OF CORRECTION

PATENT NO. : 5,994,906
DATED : November 30, 1999
INVENTOR(S) : Dennis E. Morgan, Eric J. Hangartner and Jerry Collum It is certified that error appears in the above-identified patent and that said Letters Patent is hereby corrected as shown below:

Please correct the claim 1 as follows
Delete:
[1. In hydraulic piston position sensing apparatus of the type wherein changes in a resonant frequency within a hydraulic cylinder are representative of piston position, the improvement comprising:
  a resonant frequency oscillator, and
  a fluid sample containing resonant cavity in fluid communication with the hydraulic cylinder and having a central conductor in said cavity coupled into said oscillator, whereby a change in a resonance in said cavity provides a change in output frequency of said oscillator indicative of changes in the dielectric properties of the fluid.]
Add:
--1. In hydraulic piston position sensing apparatus of the type wherein changes in a resonant frequency within a hydraulic cylinder are representative of piston position, the improvement comprising:
  a resonant frequency oscillator, and
  a fluid sample containing resonant cavity in fluid communication with the hydraulic cylinder and having a central conductor in said cavity coupled into said oscillator, wherein an output frequency of said oscillator is indicative of changes in the dielectric properties of the fluid in said resonant cavity, and sensed piston positions include dielectric property compensation based upon said oscillator output frequency.--

Signed and Sealed this

Sixteenth Day of January, 2001

Attest:

Attesting Officer

Q. TODD DICKINSON

Commissioner of Patents and Trademarks